(12) United States Patent
Savelli et al.

(10) Patent No.: US 9,358,428 B2
(45) Date of Patent: Jun. 7, 2016

(54) RACKET WITH PIEZOELECTRIC STRINGS

(71) Applicant: Commissariat A L'Energie Atomique Et Aux Energies Alternatives, Paris (FR)

(72) Inventors: Guillaume Savelli, Grenoble (FR); Philippe Coronel, Barraux (FR)

(73) Assignee: Commissariat A L'Energie Atomique Et Aux Energies Alternatives, Paris (FR)

(*) Notice: Subject to any disclaimer, the term of this patent is extended or adjusted under 35 U.S.C. 154(b) by 0 days.

(21) Appl. No.: 14/691,877

(22) Filed: Apr. 21, 2015

(65) Prior Publication Data
US 2015/0306469 A1 Oct. 29, 2015

(30) Foreign Application Priority Data

Apr. 25, 2014 (FR) ...................................... 14 53766

(51) Int. Cl.
| A63B 51/02 | (2015.01) |
| A63B 69/38 | (2006.01) |
| H01L 41/087 | (2006.01) |
| H01L 41/113 | (2006.01) |
| H02N 2/18 | (2006.01) |
| A63B 49/08 | (2015.01) |
| A63B 24/00 | (2006.01) |

(52) U.S. Cl.
CPC ................. *A63B 51/02* (2013.01); *A63B 69/38* (2013.01); *H01L 41/087* (2013.01); *H01L 41/113* (2013.01); *H02N 2/183* (2013.01); *A63B 49/08* (2013.01); *A63B 2024/0043* (2013.01); *A63B 2051/023* (2013.01); *A63B 2208/0204* (2013.01); *A63B 2220/58* (2013.01); *A63B 2220/833* (2013.01); *A63B 2225/50* (2013.01)

(58) Field of Classification Search
CPC ................... A63B 2051/001; A63B 2051/002; A63B 2051/004; A63B 2220/00
USPC .......................... 473/524, 520–522, 540, 543
See application file for complete search history.

(56) References Cited

U.S. PATENT DOCUMENTS 4,257,594 A   3/1981   Conrey et al.

FOREIGN PATENT DOCUMENTS

DE    29 42 533 A1    4/1981

OTHER PUBLICATIONS

French Search Report (Application No. 14.53766) dated Jan. 12, 2015.

*Primary Examiner* — Gene Kim
*Assistant Examiner* — Rayshun Peng
(74) *Attorney, Agent, or Firm* — Burr & Brown, PLLC

(57) ABSTRACT

A racket having a handle, a frame attached to the handle, and strings with two perpendicular strings stretched in the frame, running back and forth in the frame. The system also includes: for each string, a piezoelectric sheath coating said string along most of its length, said sheath being divided along its length into at least three piezoelectric areas capable of each generating an independent voltage according to mechanical stress exerted on the strings; and an electronic circuit connected to the piezoelectric areas of the strings to identify a portion of the strings submitted to the highest mechanical stress according to the voltages generated by the piezoelectric areas of the strings.

10 Claims, 3 Drawing Sheets

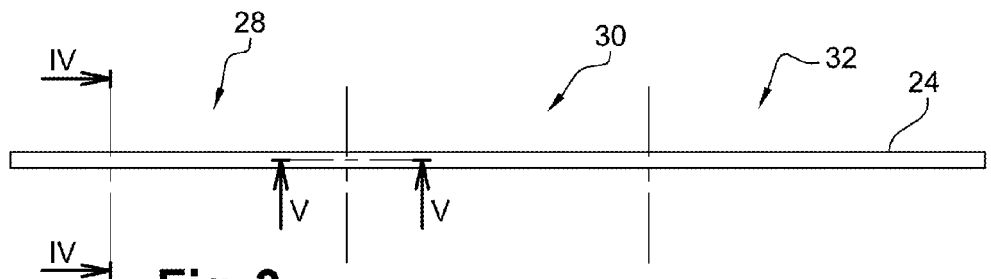
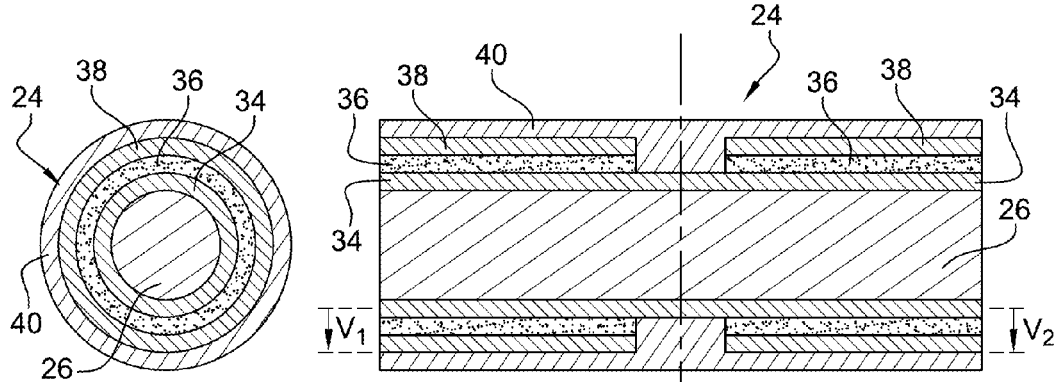
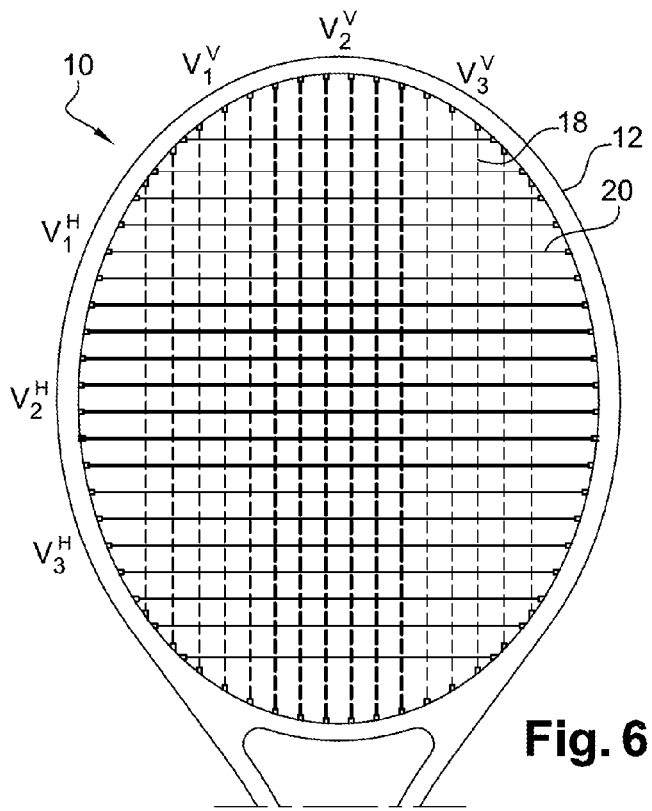
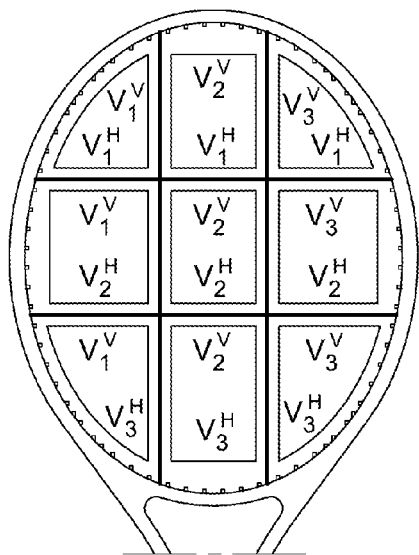

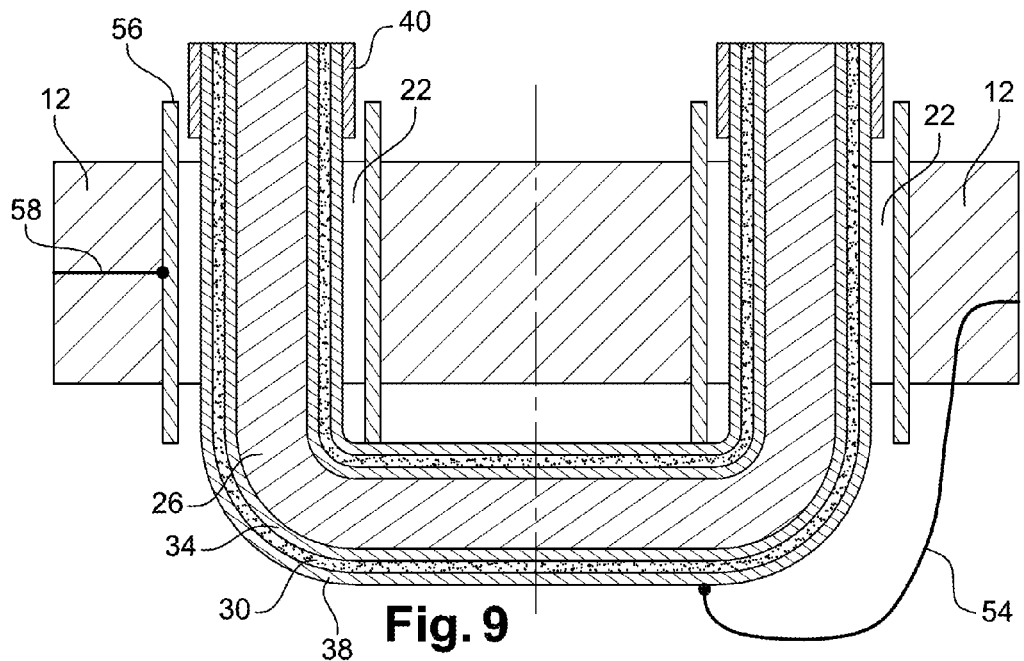
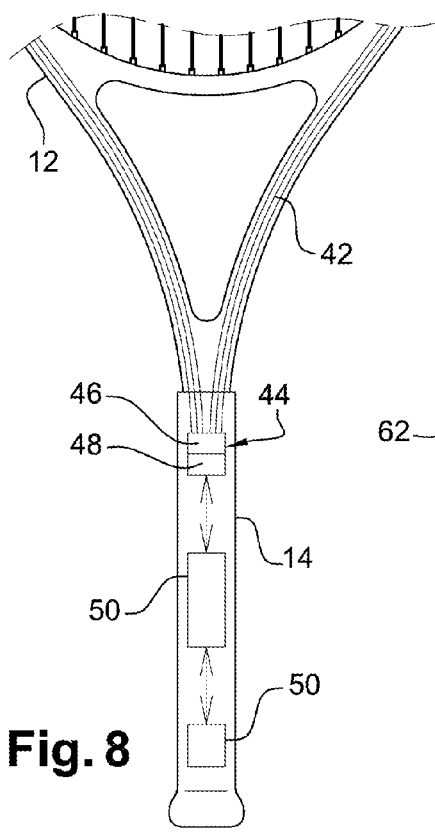
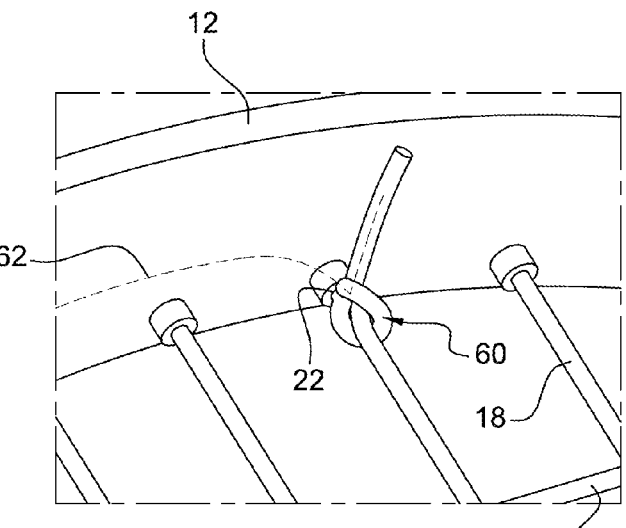

RACKET WITH PIEZOELECTRIC STRINGS

FIELD OF THE INVENTION

The invention relates to the field of string rackets, particularly tennis and badminton rackets.

BACKGROUND

Piezoelectric materials now enable to envisage multiple applications in sports, and particularly in the field of so-called "smart" rackets. Such materials indeed enable to convert mechanical energy into electric power, and conversely. For example, Head Tyrolia Mares has designed a racket having a frame comprising piezoelectric fibers and vibration sensors connected to an electronic chip. The sensors measure the vibrations of the racket frame when a ball is hit and transmit this information to the electronic chip. The latter accordingly determines an opposite vibration of the frame and controls the piezoelectric fibers of the frame so that they apply the opposite vibration, thus neutralizing the first vibrations generated by the shot. This thus results in a more rigid racket frame, which is a way to fight tennis-elbow, such an inflammation being frequently observed on 60% of regular players.

One of the main difficulties of a beginner in a string racket sport, for example, tennis, is to center the ball with respect to the racket at the time of the shot, be it forehand or backhand. Indeed, a beginner is primarily so concerned with hitting back the ball that he/she has trouble determining whether the ball is well centered. For advanced players, having statistics as to where they hit the strings of a racket, possibly in combination with the hitting power, for example enables to work on their placement and to refine their hitting technique. Currently, such information is determined by judgment, by the actual player or by a trainer, and is thus very incomplete.

Discussion of the Invention

The present invention aims at providing a system enabling to determine the position of the ball on the strings of a racket at the time of the hitting.

For this purpose, the invention aims at a system comprising a racket having a handle, a frame attached to the handle and strings comprising two perpendicular strings stretched in the frame, each string running back and forth in the frame through openings formed therein.

According to the invention, the system comprises:
for each string, a piezoelectric sheath coating said string along most of its length, said sheath being divided along its length into at least three piezoelectric areas, each comprising a piezoelectric layer interposed between two conductive layers respectively forming a first and a second electrodes, the piezoelectric layer and at least one of the electrodes of each piezoelectric area forming an assembly electrically insulated from the piezoelectric layers and the electrodes of the other piezoelectric layers so that each piezoelectric area generates between its electrodes an independent voltage according to mechanical stress exerted on the strings;
an electronic circuit connected to the piezoelectric areas of the strings to identify a portion of the strings submitted to the highest mechanical stress according to the voltages generated by the piezoelectric areas of the strings.

For clarity, and in accordance with the drawings described hereafter, the main axis of the racket handle is called "vertical" and an axis perpendicular to the main axis of the racket handle is called "horizontal". Similarly, although, for the sake of brevity, reference is made to a ball, this term applies to any type of object, for example, a shuttlecock when a badminton racket is considered.

As known per se, racket strings are comprised of two perpendicular strings, vertical (or "lengthwise strings") and horizontal (or "cross strings"), interlaced and stretched on a frame by running back and forth. By dividing each string into successive piezoelectric areas, each capable of generating a voltage according to mechanical stress exerted on its piezoelectric layer, for example, into three areas, and due to the back and forth travels of the string on the frame, the three piezoelectric areas of the string divide the racket strings into three different surfaces, each of the surfaces being associated with a voltage. For example, concerning the vertical string, this arrangement induces a vertical division of the string surface area into three areas. Similarly, for the horizontal string, the string surface area is horizontally divided into three areas. An array of three columns and three rows, comprising a central area, is thus defined, each of the areas being associated with a different couple of voltages delivered by the piezoelectric areas of the strings.

The electronic circuit, advantageously partially or totally housed within the racket handle, collects the voltages generated by the piezoelectric areas and accordingly identifies the string area having hit the ball. This information can then be used for statistical purposes and/or displayed, advantageously in real time, on a screen intended for the player or a trainer.

According to an embodiment, the sheath of each string comprises:
- a first electrically-conductive continuous layer formed along most of the length of the string, the first layer forming the first electrode of each piezoelectric area of the string;
- at least three piezoelectric layer portions, deposited on the first layer; and
- second different electrically-conductive layers, respectively deposited on the piezoelectric layers and respectively forming the second electrodes of the piezoelectric areas.

According to an embodiment, the sheath of each string comprises an external electrically-insulating protection layer. More particularly, the external layer is partially stripped along a portion opposite each piezoelectric area of the string, said stripped portion being on the frame, to expose a portion of the second layer of said area. The system especially comprises electric connections arranged on or inside of the frame and respectively welded to the exposed portions of the second layers to collect the voltage generated by said area. In particular, the electric connections continue inside of the handle, and the electronic circuit is at least partially housed within the handle and is connected to the electric connections.

According to an embodiment, the electronic circuit is entirely contained within the handle. The electronic circuit especially comprises a computer memory for storing data relative to the identified string portions and a wireless transmission circuit connected to said memory to transmit over a wireless communication link said data outside of the handle.

According to an embodiment, the electronic circuit comprises an electric power storage element for storing the electric power generated by the piezoelectric areas. The electric power storage element especially comprises a microbattery formed on a flexible or rigid substrate and/or a capacitor and/or a supercapacitor or button cells.

BRIEF DESCRIPTION OF THE DRAWINGS

The invention will be better understood on reading of the following description provided as an example only in relation with the accompanying drawings, where:

FIG. 3 is a simplified view of a string according to the invention;

FIG. 4 is a cross-section view along plane IV-IV of FIG. 3, illustrating an embodiment of a piezoelectric area forming part of the string;

FIG. 5 is a simplified view along plane V-V of FIG. 3, illustrating an intermediate area between two piezoelectric areas forming part of the string;

FIGS. 6 and 7 are simplified views of the divisions of the racket strings induced by the strings according to the invention, and the voltages associated with such divisions generated by the piezoelectric areas;

FIG. 8 is a simplified view of the electric connections to the piezoelectric areas and of an electronic circuit for processing the voltages generated by the piezoelectric areas;

FIG. 9 is a simplified cross-section view illustrating the contacting area for the connection of a piezoelectric area to collect the voltage that it has generated; and FIG. 10 is a simplified perspective view illustrating the area of contact with an electric mass of a string of the racket.

DETAILED DESCRIPTION OF THE INVENTION

Figure 1:
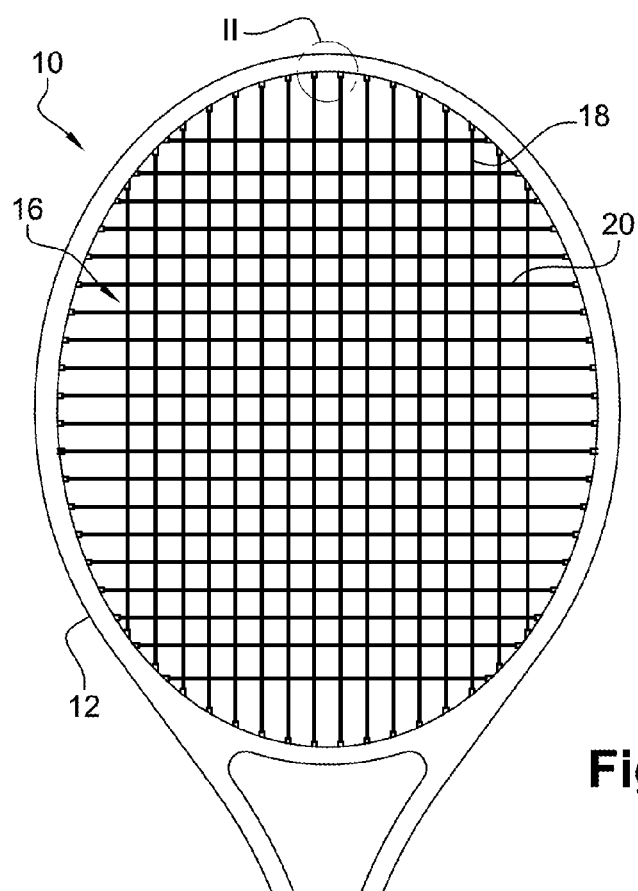
FIG. 1 is a top view of a tennis racket of the state of the art.
Figure 2:
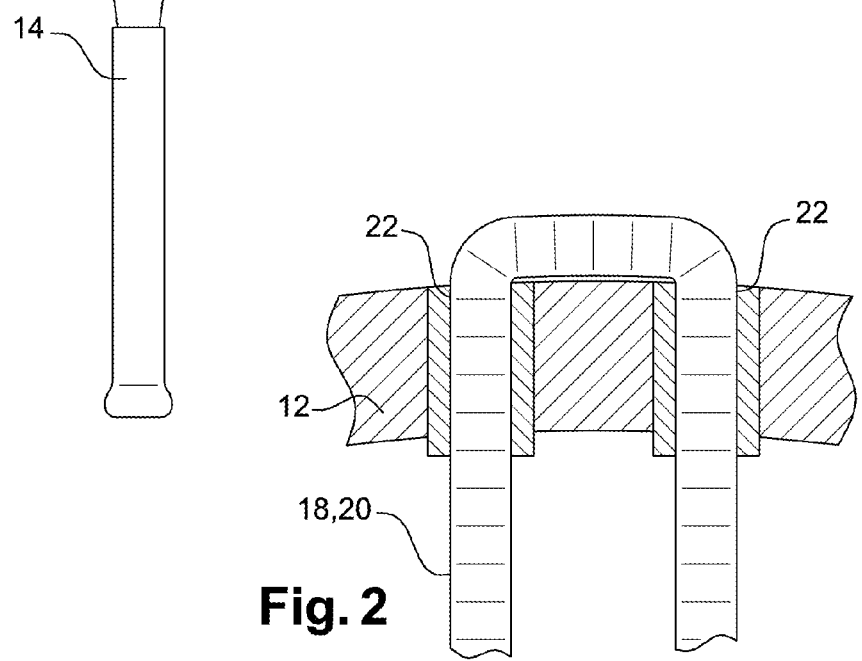
FIG. 2 is a detail cross-section view of the racket of FIG. 1 along the plane of the strings thereof.

In FIG. 1, a tennis racket 10 comprises a frame 12 continued by a handle 14, as well as strings 16 stretched in frame 12. The strings comprise a vertical tennis string 18, or "lengthwise string", interlaced with a horizontal tennis string 20, or "cross strings". As illustrated in the detail view of FIG. 2, each string 18, 20 runs back and forth in frame 12, through openings 22 formed therein, and ends at each end with a knot so that it can be maintained in place in frame 12. The arrangement just described is well known in the art in the field of tennis rackets, and will not be described in further detail for the sake of brevity.

Each string 18, 20 is further coated with a piezoelectric sheath around its entire circumference and along most of its length. As illustrated in FIGS. 3 to 5, sheath 24 coats a central core 26, such as a tennis string of the state of the art, and is divided into three piezoelectric areas 28, 30, 32 having the same structure and dimensions.

Referring to FIG. 4, each of areas 28, 30, 32 comprises:
- a first metal layer 34, coating central core 26 along the entire length and around the entire circumference thereof, first metal layer 34 forming a first electrode common to all areas 28, 30, 32;
- a layer of piezoelectric material 36, surrounding first metal layer 34 around the entire circumference and along a portion of the height thereof;
- a second metal layer 38, coating piezoelectric material layer 36 all along the length and around the circumference thereof, second metal layer 36 forming a second electrode for the piezoelectric area; and an external mechanical and electrical protection layer 40, particularly insulating, coating the entire string around the entire circumference and along most of the length of string 18, 20.

Piezoelectric layer 36 releases electric charges when it deforms, and thus releases electric charges under the effect of the hitting of a ball by racket 10. The piezoelectric material layer advantageously is a polyvinylidene fluoride or lead titanium zirconate film, which has the advantage of being both light, flexible, and mechanically resistant. As a variation, layer 36 is made of lead titanium zirconate ("LZT"), of zinc oxide ("ZnO"), or of a composite material of at least two materials among these and PVDF. Particularly, the piezoelectric layer has a thickness in the range from 10 nanometers to 500 micrometers. Metal layers 34, 38 have a thickness in the range from 1 nanometer to 100 micrometers each, and are for example made of silver, copper nitride, aluminum. The mechanical protection layer is for example made of an oxide, particularly $SiO_2$, or of $Si_2N_4$ having a thickness in the range from 100 nanometers to 1 millimeter. The different layers of sheath 24 are for example formed by a chemical deposition or a physical vapor deposition, by a printing technique, for example, by sputtering or by spin coating, or other.

As illustrated in FIG. 5, the piezoelectric areas are electrically arranged so that the stack of metal layers 34, 38 and of piezoelectric layers 36 of each of the areas generates an independent voltage under the effect of the applied mechanical stress. Particularly, piezoelectric layer 36 and second metal layer 38 of an area are electrically insulated from the piezoelectric layers and from the second metal layers of the other areas. Thus, in FIG. 5, under the effect of mechanical stress, a voltage V1 is created between metal layer 34 and metal layer 38 of the piezoelectric area illustrated on the left-hand side and a voltage V2 is created between metal layer 34 and metal layer 38 of the piezoelectric area illustrated on the right-hand side, voltages V1 and V2 being independent from each other, layer 34 being used as a ground for all the piezoelectric areas. Thus, each piezoelectric area 28, 30, 32 of the string generates an electric voltage which is specific thereto according to the mechanical stress applied to its piezoelectric layer.

Referring to FIG. 6, which illustrates the strings of racket 10 with the different piezoelectric areas, the back and forth travels of strings 18, 20 in frame 12 result in dividing the string surface:
- into three different vertical portions, respectively associated with unique voltages $V_1^V, V_2^V, V_3^V$ generated by the piezoelectric areas of vertical string 18; and
- and into three different horizontal portions, respectively associated with unique voltages $V_1^H, V_2^H, V_3^H$ generated by the piezoelectric areas of horizontal string 20.

The surface of the strings of racket 10 is thus divided into an array of three columns and three rows of string portions, each reference portion (i, j) in the array being associated with a unique voltage couple $(V_i^H, V_j^V)$.

Referring to FIG. 8, all the voltages $V_1^V, V_2^V, V_3^V, V_1^H, V_2^H, V_3^H$ generated by the piezoelectric areas of strings 18, 20 are collected by electric connections 42 housed on or inside of frame 12, and supplied to an electronic circuit 44 housed in handle 14 of racket 10. Electronic circuit 44 determines according to these voltages which string portion of the array has hit a ball. To achieve this, the circuit for example comprises an analog-to-digital converter 46 for digitizing voltages $V_1^V, V_2^V, V_3^V, V_1^H, V_2^H, V_3^H$ and a digital processing unit 48, for example, a microcontroller, implementing a processing of the digitized voltages $\hat{V}_1^V, \hat{V}_2^V, \hat{V}_3^V, \hat{V}_1^H, \hat{V}_2^H, \hat{V}_3^H$ to identify the string portion which has been hit and a computer memory for storing data relative to this identification. Circuit 44 further comprises a unit for transferring said data outside of the handle, advantageously by means of a wireless connection, for example, of radio frequency type.

According to an embodiment of the invention, digital processing unit 48 implements:
- a first software unit for identifying the respective maximum values $P_1^V, P_2^V, P_3^V, P_1^H, P_2^H, P_3^H$ of the received digitized voltages $\hat{V}_1^V, \hat{V}_2^V, \hat{V}_3^V, \hat{V}_1^H, \hat{V}_2^H, \hat{V}_3^H$; and
- a second software unit for identifying the string portion according to the couples $(P_i^H, P_j^V)$ of identified maximum values $P_1^V, P_2^V, P_3^V, P_1^H, P_2^H, P_3^H$.

In particular, the hitting of a ball causes the synchronous generation of voltages by all the piezoelectric areas of strings 18, 20. Further, due to the usual practice in rackets sports, shots are spaced apart in time by several seconds, so that the voltages resulting from the hitting of a ball are separate in time from the voltages generated for other shots. Accordingly, the electronic circuit receives sets of synchronous voltages $V_1^V, V_2^V, V_3^V, V_1^H, V_2^H, V_3^H$ in the form of a voltage pulse train and can thus easily identify the maximum point of each received voltage in a way known per se in the art. Since the string portion having been used to hit a ball generates voltages greater than the voltages of the other portions, the identified portion is thus that associated with the maximum couple $(P_i^H, P_j^V)$. For example, the identified portion is that having the maximum value $(P_i^H)^2+(P_j^V)^2$, or which is maximum in the sense of a distance of any norm of $R^2$.

Advantageously, electronic circuit 44 also implements other voltage processings, for example, the counting of the number of pulses generated from the moment when the strings have started being used, the determination of the average or individual intensity of the pulses, and/or the determination of the average or individual duration of the pulses, for example, to calculate the power of the shots.

For the electric power supply of electronic circuit 44, a rechargeable battery 50 is housed in handle 14 and is recharged by means of a connector 52 housed at the end of handle 14, as known per se in the art. The connector is for example a USB port enabling, on the one hand, to recharge a battery and, on the other hand, to recover data stored in circuit 44 by means, for example, of a USB key or of a connection to a personal computer.

As a variation, or additionally, electronic circuit 44 also comprises an electric power supply circuit which processes the voltages received for storage and recharges due to the processed voltages an electric power storage element. Particularly, the electric power storage element is advantageously formed of a microbattery formed on a flexible or rigid substrate. For example, the storage element is a rigid substrate microbattery from the "EnerChip" range of Cymbet® Corp., for example, a microbattery bearing reference "CBC050-M8C" having a 8×8 mm$^2$ surface area for a 50 µAh capacity, or a Solicore®, Inc. flexible substrate microbattery, for example, a microbattery bearing reference "SF-2529-10EC" having a foldable surface of 25.75×29 mm$^2$ for a 10-mAh capacity. As a variation, the electric power storage element comprises one or a plurality of capacitors and/or one or a plurality of supercapacitors. Such a power storage circuit particularly enables to obtain a racket which is autonomous in terms of power and/or to notably extend the duration of use thereof when a rechargeable battery is provided.

Referring to FIG. 9, to form a contacting area between a piezoelectric area of a string 18, 20 and electric connections 42, a portion of the string arranged on frame 12, and preferably in the lower portion of frame 12 to minimize the length of electric connections 42, is stripped of the external protection layer in order to access second metal layer 38.

As illustrated in the right-hand portion of FIG. 9, electric connections 42 for example comprise a conductive wire 54 for each piezoelectric area, formed of a metal core sheathed with an insulating material. Wire 54 is stripped at one end and welded to the exposed portion of second metal layer 34, wire 54 mostly extending on or inside of frame 12 all the way to electronic circuit 44. Preferably, wire 54 comes out of the frame through an opening 22 to be connected to the string.

Many variations are possible for the contacting area. For example, as illustrated in the left-hand portion of FIG. 9, a metal tube 56 is inserted into an opening 22, for example, to replace a rubber tube usually inserted in the frame openings. Due to the load of the string, it can be observed that the latter is generally pressed against a portion of the metal tube so that the portion of second metal layer 38 is in contact therewith. The dimensions of tube 56 may further be selected to guarantee such a contact. A wire 56, such as previously described, is then for example provided inside or on top of frame 12 in contact with tube 56.

Preferably, the contacting area with first electric layer 34 of each string is formed at the level of a node 60 thereof, such as illustrated in FIG. 10. The end of the string is stripped all the way to first metal layer 34 and a wire 62, also stripped at one end and housed in frame 12, comes out thereof through opening 22 of the frame which is in contact with node 60 and is welded to layer 34 of the string.

In total, the electric connections thus comprise a number of wires equal to two plus the total number of piezoelectric areas, that is, a total number of wires equal to 8 in the described embodiment.

A specific embodiment of the invention has been described. Various alterations may be made thereto, for example, those described hereabove, taken alone or combined.

Three piezoelectric areas per string have been described. Of course, their number may be higher to increase the accuracy of the tracking of the hitting of a ball on the strings. Similarly, the number of areas may be different from one string to the other.

Piezoelectric areas having a substantially equal length have been described. As a variation, their lengths are not equal, which for example enables to obtain a variable accuracy of the tracking of impacts on the strings.

Similarly, two strings have been described. A larger number of strings may be provided.

An electronic circuit which integrates all the calculation units to characterize the ball hits (position, counting, calculation of the power, etc) has also been described. As a variation, all or part of these functions are implemented outside of the racket additionally to the circuit or in place thereof. The electronic circuit is then configured to transmit the digitized voltages outside of the racket, for example, by means of its wireless connection.

Optionally, the electronic circuit is also provided to test the string wear condition. Particularly, as known per se, when an electric current is injected into a piezoelectric material, the latter vibrates. The electronic circuit is thus advantageously configured to submit, via the electric connections, a portion or all of the piezoelectric areas to non-zero voltages to make the strings vibrate, the resistance of the strings to vibrations enabling to know their wear condition.

A tennis racket has been described. Of course, the invention applies to any type of string racket, for example badminton or squash rackets.

The invention claimed is:

1. A system comprising a racket having a handle, a frame attached to the handle, and strings comprising at least two perpendicular strings stretched in the frame, each string running back and forth in the frame through openings formed therein, wherein the system comprises:

for each string, a piezoelectric sheath coating said string along most of its length, said sheath being divided along its length into at least three piezoelectric areas, each comprising a piezoelectric layer interposed between two conductive layers respectively forming a first and a second electrodes, the piezoelectric layer and at least one of the electrodes of each piezoelectric area forming an assembly electrically insulated from the piezoelectric layers and the electrodes of the other piezoelectric layers so that each piezoelectric area generates between its electrodes an independent voltage according to mechanical stress exerted on the strings; and an electronic circuit connected to the piezoelectric areas of the strings to identify a portion of the strings submitted to the highest mechanical stress according to the voltages generated by the piezoelectric areas of the strings.

2. The system of claim 1, wherein the sheath of each string comprises:
- a first electrically-conductive continuous layer formed along most of the length of the string, the first layer forming the first electrode of each piezoelectric area of the string;
- at least three piezoelectric layer portions, deposited on the first layer; and
- second different electrically-conductive layers, respectively deposited on the piezoelectric layers and respectively forming the second electrodes of the piezoelectric areas.

3. The system of claim 1, wherein the sheath of each string comprises an electrically-insulating external protection layer.

4. The system of claim 3, wherein the external layer is partially stripped along a portion opposite each piezoelectric area of the string, said stripped portion being on the frame, to expose a portion of the second layer of said area.

5. The system of claim 4, wherein it comprises electric connections arranged on or inside of the frame and respectively welded to the exposed portions of the second layers to collect the voltage generated by said area.

6. The system of claim 5, wherein the electric connections continue inside of the handle, and the electronic circuit is at least partially housed within the handle and is connected to the electric connections.

7. The system of claim 1, wherein the electronic circuit is entirely contained within the handle.

8. The system of claim 7, wherein the electronic circuit comprises a computer memory for storing data relative to the identified string portions and a wireless transmission circuit connected to said memory to transmit over a wireless communication link said data outside of the handle.

9. The system of claim 1, wherein the electronic circuit comprises an electric power storage element for storing the electric power generated by the piezoelectric areas.

10. The system of claim 9, wherein the electric power storage element comprises a microbattery formed on a flexible or rigid substrate and/or a capacitor and/or a supercapacitor or button cells.

* * * * *